(12) United States Patent
Gu

(10) Patent No.: US 12,073,874 B2
(45) Date of Patent: Aug. 27, 2024

(54) MEMORY READ-WRITE CIRCUIT, METHOD FOR CONTROLLING MEMORY, AND ELECTRONIC DEVICE

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 44 days.

(21) Appl. No.: 17/660,554

(22) Filed: Apr. 25, 2022

(65) Prior Publication Data

US 2023/0139664 A1    May 4, 2023

(30) Foreign Application Priority Data

Nov. 3, 2021    (CN) .......................... 202111295395.9

(51) Int. Cl.
| | |
|---|---|
| *G11C 11/4096* | (2006.01) |
| *G11C 11/406* | (2006.01) |
| *G11C 11/4076* | (2006.01) |
| *G11C 11/4091* | (2006.01) |
| *G11C 11/4094* | (2006.01) |

(52) U.S. Cl.
CPC ..... *G11C 11/4096* (2013.01); *G11C 11/40611* (2013.01); *G11C 11/4076* (2013.01); *G11C 11/4091* (2013.01); *G11C 11/4094* (2013.01)

(58) Field of Classification Search
CPC ........... G11C 11/4096; G11C 11/40611; G11C 11/4076; G11C 11/4091; G11C 11/4094
USPC ................................... 365/189.011, 205, 207
See application file for complete search history.

(56) References Cited

U.S. PATENT DOCUMENTS

| | | | |
|---|---|---|---|
| 5,251,177 A | 10/1993 | Akamatsu | |
| 6,337,824 B1 | 1/2002 | Kono | |
| 7,020,043 B1 | 3/2006 | Lee | |
| 7,417,912 B2 | 8/2008 | Park | |
| 2006/0126421 A1 | 6/2006 | Hwang | |
| 2006/0140032 A1 | 6/2006 | Im | |
| 2012/0275256 A1* | 11/2012 | Furutani | ........... G11C 11/40618 365/207 |

FOREIGN PATENT DOCUMENTS

KR     20030000844 A     1/2003

OTHER PUBLICATIONS

International Search Report in the international application No. PCT/CN2022/089103, mailed on Jul. 20, 2022. 5 pages with English translation.

* cited by examiner

*Primary Examiner* — Huan Hoang
(74) *Attorney, Agent, or Firm* — Syncoda LLC; Feng Ma

(57) ABSTRACT

A memory read-write circuit includes a sense amplifier and a control signal generation module. A power voltage of the sense amplifier is controlled and supplied by a first control signal or a second control signal, and a first power voltage controlled and supplied by the first control signal is greater than a second power voltage controlled and supplied by the second control signal. A control signal generation module is configured to control, in a normal read-write mode, a pulse duration for generating the first control signal to be a first duration, and control, in a refresh mode, the pulse duration for generating the first control signal to be a second duration, the second duration being less than the first duration.

18 Claims, 12 Drawing Sheets

MEMORY READ-WRITE CIRCUIT, METHOD FOR CONTROLLING MEMORY, AND ELECTRONIC DEVICE

CROSS-REFERENCE TO RELATED APPLICATION

The present application claims priority to Chinese Patent Application No. 202111295395.9 filed on Nov. 3, 2021, the disclosure of which is hereby incorporated by reference in its entirety.

BACKGROUND

Dynamic Random Access Memory (DRAM) is a common semiconductor memory device in computers, and due to its simple structure, high density, low power consumption, and low price and other advantages, DRAM is widely applied to the computer field and the electronics industry.

For the DRAM, higher performance is often required in the read-write stage to ensure that the DRAM achieves a better user experience.

In the refresh stage, the DRAM does not need to have the same high performance. Therefore, different control modes are used in the read-write stage and the refresh stage, which is of great significance for reducing the power consumption of the DRAM.

It is to be noted that the information disclosed in the Background is only for enhancement of understanding of the background of the present disclosure, and therefore may contain information that does not form the prior art that is already known to a person of ordinary skill in the art.

SUMMARY

The present disclosure relates to the technical field of integrated circuits, and in particular, to a memory read-write circuit, a method for controlling a memory, and an electronic device. An objective of the present disclosure is to provide a memory read-write circuit, a method for controlling a memory, and an electronic device, to reduce instantaneous current of the DRAM in the refresh mode.

Other features and advantages of the present disclosure become apparent from the following detailed description, or are learned in part by practice of the present disclosure.

According to a first aspect of the present disclosure, there is provided a memory read-write circuit, including a sense amplifier and a control signal generation module. A power voltage of the sense amplifier is controlled and supplied by a first control signal or a second control signal, and a first power voltage controlled and supplied by the first control signal is greater than a second power voltage controlled and supplied by the second control signal. The control signal generation module is configured to control, in a normal read-write mode, a pulse duration for generating the first control signal to be a first duration, and control, in a refresh mode, a pulse duration for generating the first control signal to be a second duration, the second duration being less than the first duration.

According to a second aspect of the present disclosure, there is provided a method for controlling a memory, which includes a sense amplifier. A power voltage of the sense amplifier is controlled and supplied by a first control signal or a second control signal, and a power voltage controlled and supplied by the first control signal is greater than a power voltage controlled and supplied by the second control signal. The method includes: controlling, in a normal read-write mode, a pulse duration for generating the first control signal to be a first duration; and controlling, in a refresh mode, the pulse duration for generating the first control signal to be a second duration, the second duration being less than the first duration.

According to a third aspect of the present disclosure, there is provided an electronic device, including a plurality of memory blocks, a plurality of array controllers, and a plurality of the memory read-write circuits. The memory read-write circuits are disposed in the array controllers, and each memory read-write circuit controls one array.

It should be understood that the above general description and the following detailed description are only exemplary and explanatory, and cannot limit the present disclosure.

BRIEF DESCRIPTION OF THE DRAWINGS

The accompanying drawings here, which are incorporated herein and constitute a part of the specification, illustrate embodiments consistent with the present disclosure and, together with the specification, serve to explain the principles of the present disclosure. Apparently, the accompanying drawings in the following description show merely some embodiments of the present disclosure, and a person of ordinary skill in the art may obtain other accompanying drawings from these accompanying drawings without creative efforts. In the accompanying drawings.

DETAILED DESCRIPTION

Figure 1:
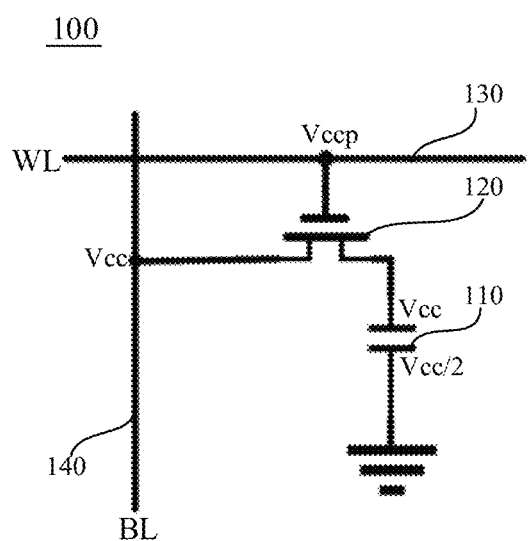
FIG. 1 schematically illustrates a schematic diagram of a structure of a memory cell according to an example embodiment of the present disclosure.

Example embodiments are described more fully with reference to the accompanying drawings. However, example embodiments can be implemented in various forms and should not be construed as limited to the embodiments set forth herein. Rather, these embodiments are provided so that the present disclosure is thorough and complete, and fully conveys the concept of example embodiments to a person skilled in the art. The same reference numerals in the figures represent the same or similar parts, and thus the repeated descriptions thereof are omitted.

In addition, the described features, structures, or characteristics may be combined in any suitable manner in one or more embodiments. In the following description, numerous specific details are provided in order to give a thorough understanding of the embodiments of the present disclosure. However, a person skilled in the art may appreciate that the technical solutions of the present disclosure may be practiced without one or more of the specific details, or other methods, components, apparatuses, steps, etc. may be employed. In other cases, well-known structures, methods, apparatuses, implementations, materials, or operations are not illustrated or described in detail to avoid obscuring aspects of the present disclosure.

The block diagrams illustrated in the figures are merely functional entities and do not necessarily correspond to physically separate entities. That is, these functional entities may be implemented in software, or these functional entities or parts of functional entities may be implemented in one or more software-hardened modules, or these functional entities may be implemented in different network and/or processor apparatuses and/or microcontroller apparatuses.

A semiconductor memory is used in computers, servers, handheld devices such as mobile phones, printers, and many other electronic devices and applications. A memory array of the semiconductor memory includes a plurality of memory cells, each memory cell storing at least one bit of information. The DRAM is an example of such a semiconductor memory. The solution of the present disclosure is preferably used in the DRAM. Accordingly, the following description of the embodiments is made with reference to a DRAM as a non-limiting example.

In a DRAM integrated circuit device, a memory cell array is typically arranged in rows and columns, so that a particular memory cell may be addressed by specifying the row and column of its array. Word lines connect the rows to a set of bit line sense amplifiers that detect data in the units. Then in a read operation, a data subset in the sense amplifier is selected or "column select" for output.

Referring to FIG. 1, each memory cell 100 in the DRAM generally includes a capacitor 110, a transistor 120, a Word Line (WL) 130, and a Bit Line (BL) 140. A gate of the transistor 120 is connected to the word line 130, a drain of the transistor 120 is connected to the bit line 140, and a source of the transistor 120 is connected to the capacitor 110. A voltage signal on the word line 130 can control ON/OFF of the transistor 120, and then data information stored in the capacitor 110 is read through the bit line 140, or data information is written into the capacitor 110 through the bit line 140 for storage.

Figure 2:
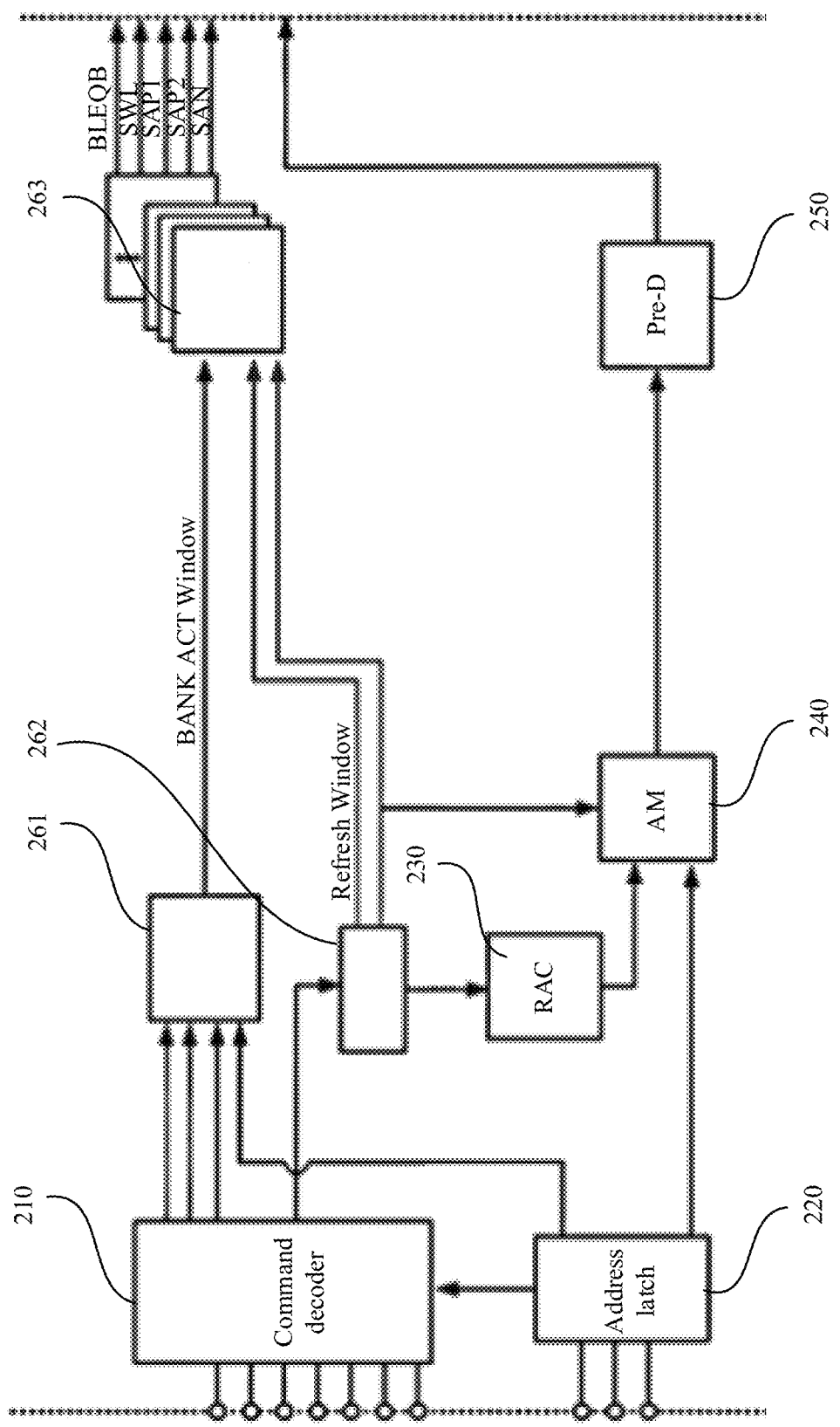
FIG. 2 schematically illustrates a schematic diagram of a structure of a peripheral circuit in a DRAM according to an example embodiment of the present disclosure.

A memory block consists of a plurality of memory cells. The memory block generally occupies 50-65% of the area of the entire DRAM device, and the remaining area of the DRAM is generally occupied by the peripheral circuit. FIG. 2 illustrates a schematic diagram of a structure of the peripheral circuit. As illustrated in FIG. 2, the peripheral circuit of the DRAM device includes a command decoder 210, an address latch 220, a Refresh Address Counter (RAC) 230, an Address Mux (AM) 240, and a Pre-Decoder (Pre-D) 250. The command decoder 210 is configured to perform command decoding on commands (CMDs) such as RESET_n, CKE, CK_t/CK_c, PAR, TEN, CS_n, and ACT_n issued by a system. The address latch 220 is configured to temporarily store an address code A<16:0>, etc.

In addition, the peripheral circuit of the DRAM device further includes the memory read-write circuit provided in embodiments of the present disclosure. The memory read-write circuit mainly includes an activation window signal generation module 261, a refresh window signal generation module 262, and a control signal generation module 263. The activation window signal generation module 261 and the refresh window signal generation module 262 are respectively connected to the control signal generation module 263. The activation window signal generation module 261 is configured to generate a memory block activation window signal (i.e., BANK ACT Window). The refresh window signal generation module 262 is configured to generate a refresh window signal (i.e., Refresh Window).

For the peripheral circuit of the DRAM device, the command decoder 210 and the address latch 220 are respectively connected to the activation window signal generation module 261, and configured to provide an input signal for the activation window signal generation module 261, so that the activation window signal generation module 261 generate the memory block activation window signal (i.e., BANK ACT Window). The refresh window signal generation module 262 is connected to the command decoder 210, and generates the refresh window signal (i.e., Refresh Window) in the case of decoding a refresh signal.

Figure 3:
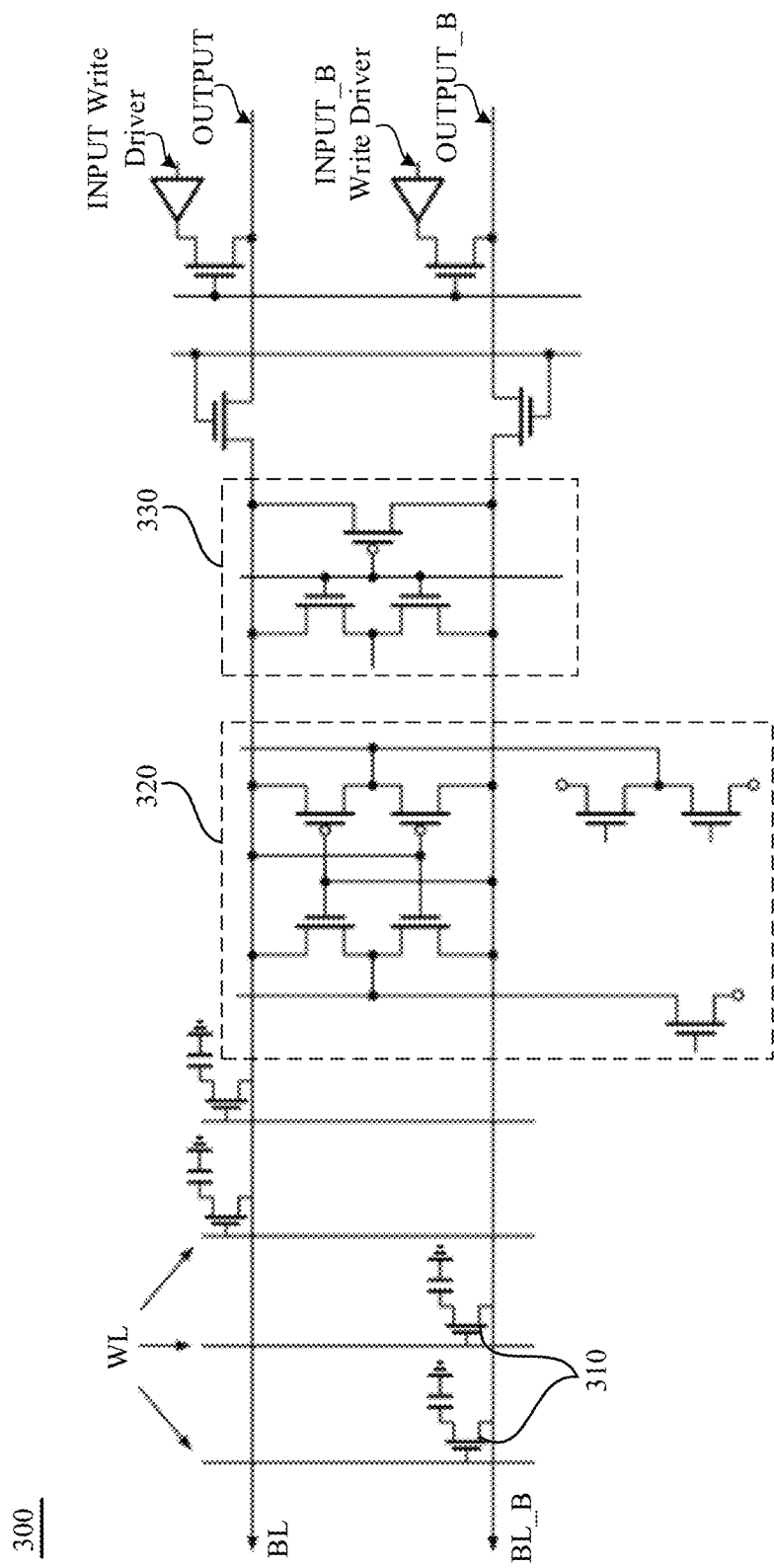
FIG. 3 schematically illustrates a schematic diagram of a structure of a memory block in a DRAM according to an example embodiment of the present disclosure.

Before introducing the control signal generation module 263 in the embodiments of the present disclosure, it is necessary to briefly describe the internal structure of the memory block BANK in the memory. FIG. 3 illustrates a schematic diagram of a structure of the memory block. The memory block 300 includes a bit line BL, a complementary bit line BL_B, a plurality of word lines WL, and a plurality of memory cells 310. The plurality of memory cells 310 share the bit line BL or the complementary bit line BL_B. In addition, the bit line BL and the complementary bit line BL_B are further configured to be connected to write input drivers (i.e., INPUT Write Driver and INPUT_B Write Driver), and output signals OUTPUT and OUTPUT_B.

In an example embodiment of the present disclosure, the memory block 300 further includes a sense module 320 and a bit line balance module 330. The bit line balancing module 330 is configured to knead the bit line BL and the complementary bit line BL_B under the action of a bit line balance control signal BLEQ, to close the read-write operations on the memory cells 310.

Referring to FIG. 3, the sensing module 320 mainly includes a sense amplifier. The Sense Amplifier (SA) may address the plurality of memory cells 310 through lines called bit lines BL or BL_B. A conventional sense amplifier is more specifically a differential amplifier that operates with a bit line BL and a complementary bit line BL_B (as a reference line) to detect and amplify the voltage difference across a pair of bit lines BL and BL_B.

Figure 4:
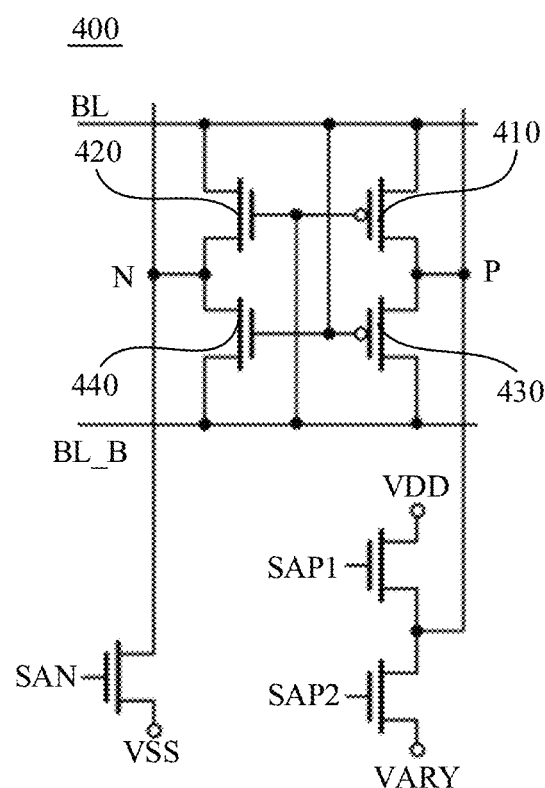
FIG. 4 schematically illustrates a schematic diagram of a structure of a sense amplifier in a DRAM according to an example embodiment of the present disclosure.

Referring to FIG. 4, four transistors in the sense amplifier 400 are a first transistor 410, a second transistor 420, a third transistor 430, and a fourth transistor 440, respectively. The first transistor 410 and the third transistor 430 are Positive channel Metal Oxide Semiconductor (PMOS) transistors. The second transistor 420 and the fourth transistor 440 are Negative channel Metal Oxide Semiconductor (NMOS) transistors. If data stored in the memory cell 310 is 1, during the read operation, the voltage on the word line WL is first pulled up to Vccp, and a transistor in the memory cell 310 is turned on. In this case, the memory cell 310 is in a read/write active state. The voltage on a pair of bit lines BL and BL_B is turned off. When 1 is read, a positive voltage is generated on the bit line BL, and this positive voltage causes the fourth transistor 440 to be turned on, so that a negative voltage on a N node is applied to line BL_B and a gate of the first transistor 410, and turn the first transistor 410 on. Finally, a Vcc voltage on a P node is applied to the line BL, so that it is easy and accurate to determine whether the data stored in the memory cell is 1 or 0 according to whether the voltage difference on a pair of bit lines is +Vcc or −Vcc.

As illustrated in FIG. 1, for the capacitor 110, when 1 is to be written, a voltage Vcc is applied to the bit line BL. The voltage Vcc passes through the turned-on transistor 120, is conducted from a drain to a source, and finally loaded to a polar plate of the capacitor 110. When 0 is to be written, a voltage of 0 V is applied to the bit line BL, so that the voltage on the polar plate of the capacitor 110 is also 0 V. The process of writing 1 or 0 to the capacitor 110 is the same.

When the capacitor 110 writes 1 or 0, the voltage on the polar plate of the capacitor 110 is 1 or 0. After the writing is completed, the voltage on BL returns to $V_{cc}/2$. When reading data, after the transistor 120 is turned on, the capacitor 110 and BL share the charge, so that the voltage on BL changes. It can be determined whether the data stored in the memory cell is 1 or 0 according to the increase or decrease of the voltage on BL.

During the read operation of the DRAM memory cell, a voltage greater than the turn-on voltage of the transistor 120 needs to be applied to the word line WL of the memory cell, to turn on the transistor 120. In this case, the charges on the capacitor 110 are released to the bit lines BL and BL_B through the transistor 120.

For the memory read-write circuit provided by the embodiments of the present disclosure, whether it is in a normal read-write mode or a refresh mode, signal amplification needs to be completed by a sense amplifier.

In the memory read-write circuit provided by example embodiments of the present disclosure, the control signal generation module 263 is configured to control the memory to enter the refresh mode responsive to simultaneous acquisition of the memory block activation window signal (i.e., BANK ACT Window) and the refresh window signal (i.e., Refresh Window), and control the memory to enter the normal read-write mode responsive to acquisition of the activation window signal (i.e., BANK ACT Window) only.

Referring to FIG. 2 and FIG. 4, under the control of the control signal generation module 263 provided by example embodiments of the present disclosure, a power voltage of the sense amplifier 400 may be controlled and supplied by a first control signal SAP1, or may be controlled and supplied by a second control signal SAP2. Moreover, a first power voltage VDD controlled and supplied by the first control signal SAP1 is greater than a second power voltage VARY controlled and supplied by the second control signal SAP2.

By setting the power voltages VDD and VARY with different magnitudes for the sense amplifier 400, at the beginning of the normal read-write mode, a larger first power voltage VDD may be adopted to supply power, to reduce the time consumed by the sensing and cell storage process, thereby achieving the effect of optimizing the performance such as a row addressing to column addressing delay time (tRCD) and the shortest period from memory row active to precharge (tRAS).

In the refresh mode, a power supply manner different from that in the normal read-write mode may be set. For example, in the normal read-write mode, a pulse duration for generating the first control signal SAP1 is controlled to be a first duration, and a duration of the supply of the first power voltage VDD is the first duration. In the refresh mode, the pulse duration for generating the first control signal SAP1 is controlled to be a second duration, and a duration of the supply of the first power voltage VDD is the second duration.

In the example embodiments of the present disclosure, the second duration is less than the first duration. That is, the duration of the supply of the first power voltage VDD adopted in the refresh mode is less than the duration of the supply of the first power voltage VDD adopted in the normal read-write mode. In this way, in the refresh mode that does not have higher requirements for tRCD performance, by reducing the duration of the supply of the first power voltage VDD, it can not only meet the refresh requirements, but also reduce the consumption of VDD current in the refresh process, thus avoiding the occurrence of excessive instantaneous current in the refresh mode, and reducing the design requirements for VDD carrying capacity.

Figure 5:
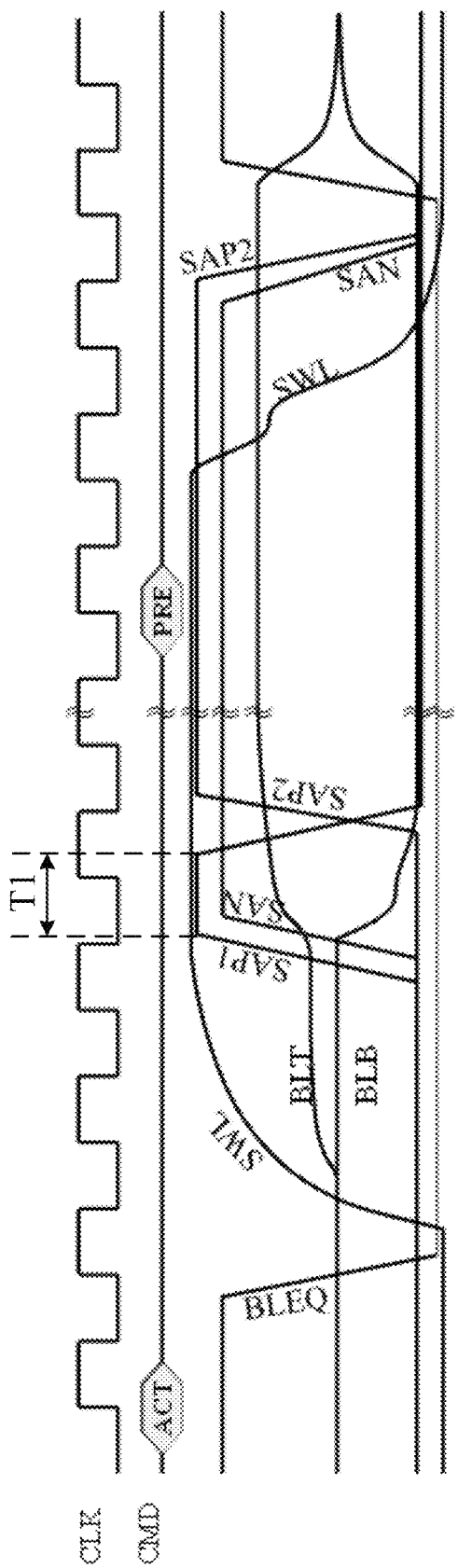
FIG. 5 schematically illustrates a waveform diagram of a control signal of a memory in a normal read-write mode according to an exemplary embodiment of the present disclosure.
Figure 6:
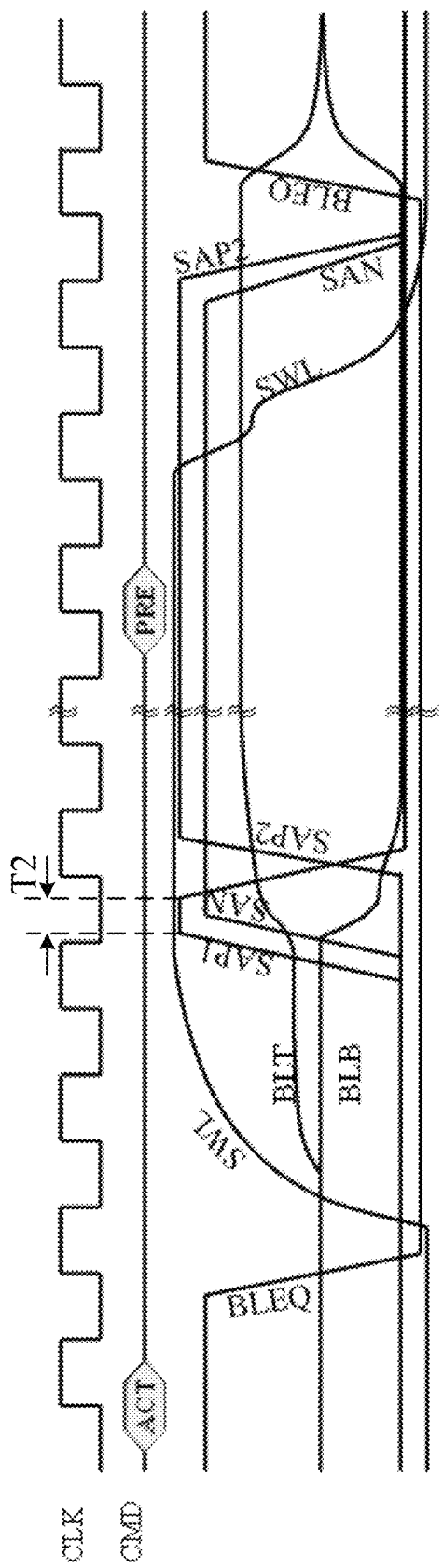
FIG. 6 schematically illustrates a first waveform diagram of a control signal of a memory in a refresh mode according to an exemplary embodiment of the present disclosure.

FIG. 5 illustrates a waveform diagram of a control signal of a memory in normal read-write mode. FIG. 6 illustrates a waveform diagram of a control signal of a memory in a refresh mode. Taking a clock signal CLK as a reference, upon comparison of FIG. 5 and FIG. 6, a pulse duration T2 of the first control signal SAP1 in the refresh mode is significantly less than a pulse duration T1 of the first control signal SAP1 in the normal read-write mode, so that the duration of supply of the first power voltage VDD is reduced in the refresh mode.

Figure 7:
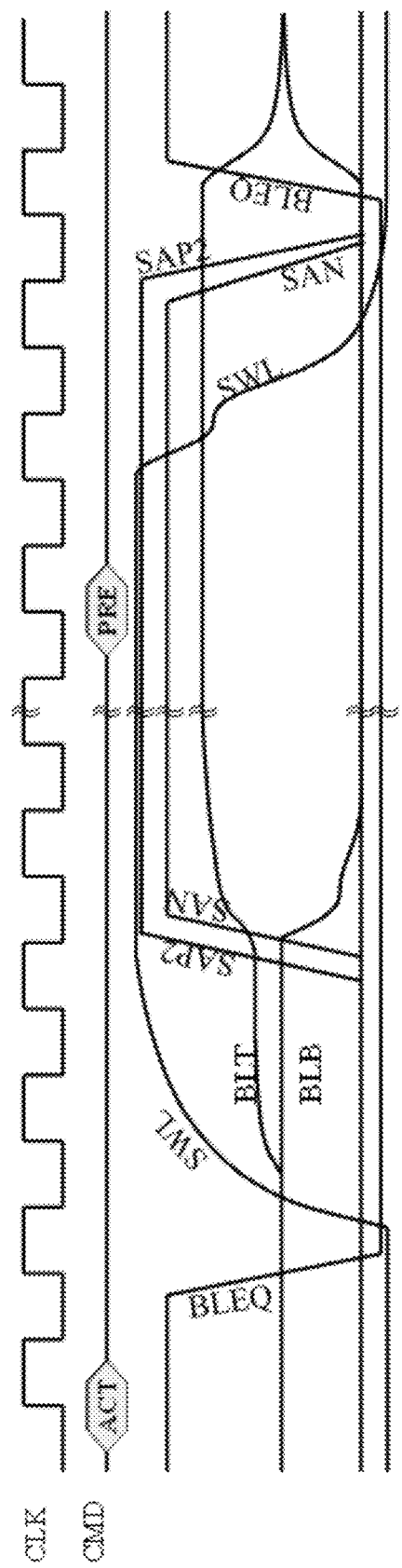
FIG. 7 schematically illustrates a second waveform diagram of a control signal of a memory in a refresh mode according to an exemplary embodiment of the present disclosure.

Even as illustrated in FIG. 7, in the refresh mode, the control of the first control signal SAP1 is cancelled, and the pulse duration of the first control signal SAP1, i.e., the second duration, is set to 0. In this case, in the refresh mode, the first control signal SAP1 is not generated, and the second control signal SAP2 is directly generated. That is, the first power voltage VDD is not supplied for the sense amplifier 400, but the second power voltage VARY is directly supplied for the sense amplifier 400. Therefore, the instantaneous current of the memory in the refresh mode may be further reduced, and the VDD carrying capacity of the memory may be further improved.

In actual applications, the first power voltage VDD may be 1.2-1.3 V, e.g., 1.25 V. The second power voltage VARY may be 0.9-1.1 V, e.g., 1 V. The example embodiments of the present disclosure do not specifically limit the specific values of the first power voltage VDD and the second power voltage VARY.

It is to be noted that PRE in FIG. 5 to FIG. 7 represents a precharge command. Under the precharge command, the reading and writing operations end, and the process of precharging the capacitor of the memory cell is entered.

In the example embodiments of the present disclosure, the control signal generation module 263 is further configured to control, in the normal read-write mode or the refresh mode, generation of a second control signal SAP2 responsive to termination of the first control signal SAP1. Moreover, a pulse duration of the second control signal SAP2 is greater than the pulse duration of the first control signal SAP1. That is, whether in the normal read-write mode or in the refresh mode, the first power voltage VDD is only used in the initial stage, and in most subsequent read-write or refresh processes, the power voltage of the memory is supplied by the second power voltage VARY. The purpose of initially setting the first power voltage VDD is mainly to reduce the delay and improve the memory read-write performance.

In the example embodiments of the present disclosure, as illustrated in FIG. 4, a negative voltage of the sense amplifier 400 is controlled and supplied by a negative control signal SAN. As can be seen from FIG. 5 and FIG. 6, the control signal generation module 263 is further configured to control generation of a negative control signal SAN after generating the first control signal SAP1. As can be seen from FIG. 7, the control signal generation module 263 is further configured to control generation of a negative control signal SAN after generating the second control signal SAP2.

As illustrated in FIG. 2, the control signal generation module 263 provided by the embodiments of the present disclosure also controls generation of a bit line balance control signal BLEQB and a word line turn-on voltage SWL in addition to generation of the first control signal SAP1, the second control signal SAP2, and the negative control signal SAN. The control signal generation module 263 is further configured to turn off, before generating the first control signal SAP1 and the second control signal SAP2, the bit line balance control signal BLEQ applied to the bit line BL and the complementary bit line BL_B, to separate the kneaded bit line BL and the complementary bit line BL_B (that is, the BLT and BLB in the figure are separated), to enter the read-write operation of the memory cell 310. Then, the word line turn-on voltage SWL is applied on the word line to turn on a transistor connected to the word line, and the voltage on the capacitor connected to the transistor is released to the bit line BL through charge sharing, resulting in a voltage difference. Next, the voltage difference is amplified by the sense amplifier 400, that is, the first power voltage SAP1, the second power voltage SAP2, and the negative control signal SAN are generated. When the read-write process is about to end, the word line turn-on voltage SWL is turned off, and at the same time, the bit line balance control signal BLEQB is generated to knead the bit line BL and the complementary bit line BL_B (that is, the voltages on BLT and BLB in the figure are equal) to close the read-write operation on the memory cell 310, to complete a normal read-write process or a refresh process.

Figure 8:
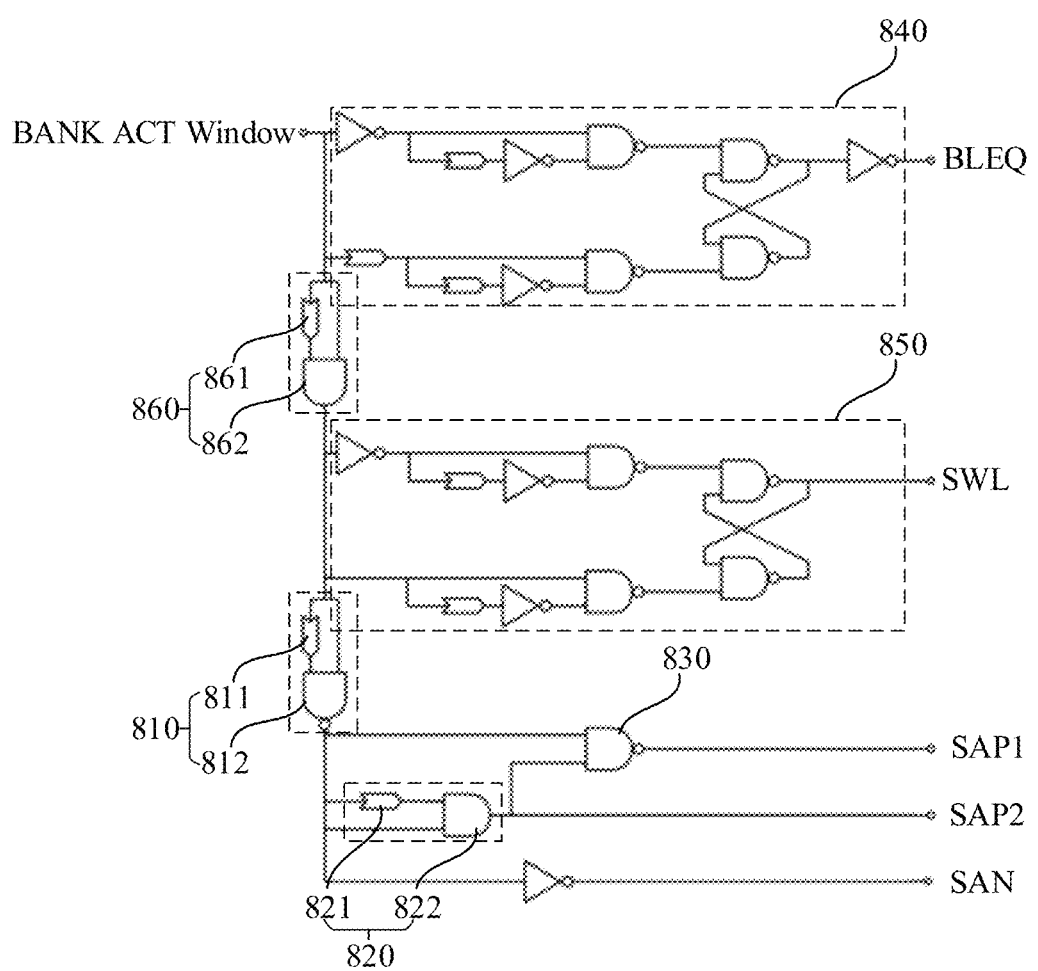
FIG. 8 schematically illustrates a schematic diagram of a circuit structure of a control signal generation module in a memory read-write circuit according to an exemplary embodiment of the present disclosure.

On this basis, referring to FIG. 8, the example embodiment of the present disclosure provides a circuit structure of a control signal generation module in a memory read-write circuit. In FIG. 8, the control signal generation module includes a first delay submodule 810, a second delay submodule 820, and a first NAND gate 830. An input terminal of the first NAND gate 830 is connected to an output terminal of the first delay submodule 810 and an output terminal of the second delay submodule 820, and an output terminal of the first NAND gate 830 outputs the first control signal SAP1.

An input terminal of the second delay submodule 820 is connected to the output terminal of the first delay submodule 810, an input terminal of the first delay submodule 810 is inputted with the memory block activation window signal (i.e., BANK ACT Window) or a delay signal of the memory block activation window signal (i.e., BANK ACT Window), and the output terminal of the second delay submodule 820 outputs the second control signal SAP2.

In the example embodiments of the present disclosure, the first delay submodule 810 includes a first delay unit 811 and a second NAND gate 812. An input terminal of the second NAND gate 812 is connected to an output terminal of the first delay unit 811 and is inputted with the memory block activation window signal (i.e., BANK ACT Window), and an input terminal of the first delay unit 811 is inputted with the memory block activation window signal (i.e., BANK ACT Window).

Figure 9:
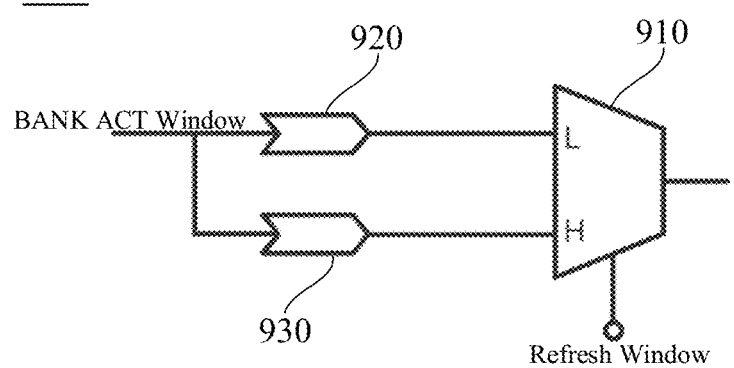
FIG. 9 schematically illustrates a schematic diagram of a circuit structure of a first delay unit in a memory read-write circuit according to an exemplary embodiment of the present disclosure.

Referring to FIG. 9, the first delay unit 811 includes a first multiplexer 910, and a first delay device 920 and a second delay device 930 which are connected to the first multiplexer 910. The first delay device 920 and the second delay device 930 are respectively configured to delay the memory block activation window signal (i.e., BANK ACT Window), and a delay duration of the first delay device 920 is greater than a delay duration of the second delay device 930. A control terminal of the first multiplexer 910 is inputted with the refresh window signal (i.e., Refresh Window). The first multiplexer 910 is configured to select and output a delay signal of the second delay device 930 responsive to generation of the refresh window signal (i.e., Refresh Window), and select and output a delay signal of the first delay device 920 responsive to no generation of the refresh window signal. In this way, responsive to generation of the refresh window signal (i.e., Refresh Window), a delay duration of the selected and outputted delay signal of the second delay device 930 is shorter. Compared to the normal refresh mode, a pulse duration of the finally obtained first control signal SAP1 is shorter.

Referring to FIG. 8, the second delay submodule 820 includes a second delay unit 821 and a first AND gate 822. An input terminal of the first AND gate 822 is respectively connected to an output terminal of the second delay unit 821 and the output terminal of the first delay submodule 810, and an input terminal of the second delay unit 821 is connected to the output terminal of the first delay submodule 810.

Figure 10:
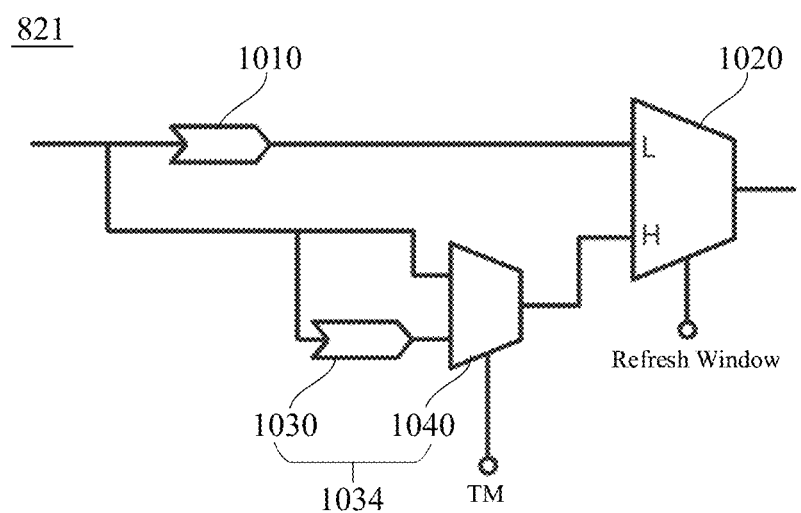
FIG. 10 schematically illustrates a schematic diagram of a circuit structure of a second delay unit in a memory read-write circuit according to an exemplary embodiment of the present disclosure.

Referring to FIG. 10, in the example embodiments of the present disclosure, the second delay unit 821 includes a third delay device 1010, a delay selection unit 1034, and a second multiplexer 1020. The third delay device 1010 is configured to delay an output signal of the first delay submodule 810, an input terminal of the delay selection unit 1034 is inputted with the output signal of the first delay submodule 810, and an output terminal of the delay selection unit 1034 is connected to an input terminal of the second multiplexer 1020. A control terminal of the second multiplexer 1020 is inputted with the refresh window signal (i.e., Refresh Window), and the second multiplexer 1020 is configured to select and output an output signal of the delay selection unit 1034 responsive to generation of the refresh window signal (i.e., Refresh Window), and select and output an output signal of the third delay device 1010 responsive to no generation of the refresh window signal.

The delay selection unit 1034 includes a delay subunit 1030 and a sub-multiplexer 1040. An input terminal of the delay subunit 1030 is inputted with the output signal of the first delay submodule 810, and an input terminal of the sub-multiplexer 1040 is inputted with the output signal of the first delay submodule 810 and an output signal of the delay subunit 1030. A control terminal of the sub-multiplexer 1040 is inputted with a test signal TM. In the presence of the test signal TM, the sub-multiplexer 1040 selects and outputs the output signal of the first delay submodule 810. Responsive to generation of the refresh window signal Refresh Window, the second delay unit 821 outputs the output signal of the first delay submodule 810. After passing through the first AND gate 822, the SAP1 is turned off at the output terminal of the first NAND gate 830, that is, the pulse duration of the first control signal SAP1 is 0.

Referring to FIG. 8, the control signal generation module further includes a bit line balance control signal generation submodule 840, a word line turn-on voltage generation submodule 850, and a third delay submodule 860. An input terminal of the bit line balance control signal generation submodule 840 is inputted with the memory block activation window signal (i.e., BANK ACT Window), and an output terminal of the bit line balance control signal generation submodule 840 outputs the bit line balance control signal (i.e., BLEQ). An input terminal of the word line turn-on voltage generation submodule 850 is connected to an output terminal of the third delay submodule 860, an output terminal of the word line turn-on voltage generation submodule 850 outputs the word line turn-on voltage SWL, and an input terminal of the third delay submodule is inputted with the memory block activation window signal (i.e., BANK ACT Window).

After the memory block activation window signal (i.e., BANK ACT Window) is generated, it is necessary to generate the word line turn-on voltage SWL no matter in the normal read-write mode or in the refresh mode. As an example, as illustrated in FIG. 8, the word line turn-on voltage SWL includes a plurality of delay units, a plurality of NAND gates, and a plurality of inverters. The specific connections are not described herein. Since the bit line balance control signal BLEQ needs to be turned off before generating the word line turn-on voltage SWL, the word line turn-on voltage generation submodule 850 is provided with one more delay unit than the bit line balance control signal generation submodule 840.

In addition, compared with the word line turn-on voltage generation submodule 850, the bit line balance control signal generation submodule 840 is provided with an inverter at the output terminal, to achieve the purpose of turning off the generated bit line balance control signal BLEQ.

In practical applications, there may be various circuit connection manners for forming the bit line balance control signal generation submodule 840 and the word line turn-on voltage generation submodule 850. The example embodiments of the present disclosure are not limited to FIG. 8.

In the example embodiments of the present disclosure, the third delay submodule 860 includes a third delay unit 861 and a second AND gate 862. An input terminal of the second AND gate 862 is inputted with an output signal of the third delay unit 861 and the memory block activation window signal (i.e., BANK ACT Window), and an input terminal of the third delay unit 861 is inputted with the memory block activation window signal (i.e., BANK ACT Window).

Figure 11:
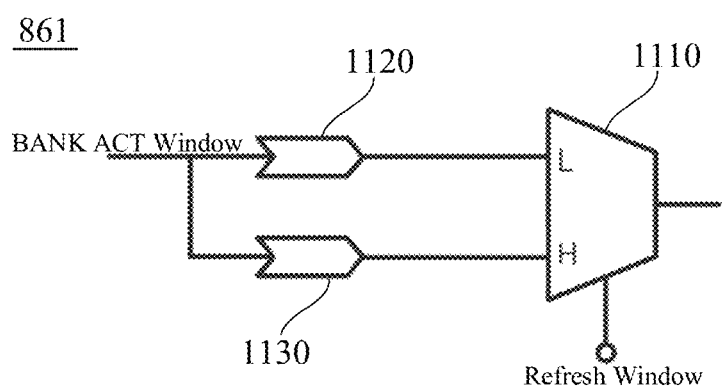
FIG. 11 schematically illustrates a schematic diagram of a circuit structure of a third delay unit in a memory read-write circuit according to an exemplary embodiment of the present disclosure.

Referring to FIG. 11, in the example embodiments of the present disclosure, the third delay unit 861 includes a third multiplexer 1110, and a fourth delay device 1120 and a fifth delay device 1130 which are connected to the third multiplexer 1110. The fourth delay device 1120 and the fifth delay device 1130 are respectively configured to delay the memory block activation window signal (i.e., BANK ACT Window), and a delay duration of the fourth delay device 1120 is greater than a delay duration of the fifth delay device 1130. A control terminal of the third multiplexer 1110 is inputted with the refresh window signal (i.e., Refresh Window), and the third multiplexer 1110 is configured to select and output a delay signal of the fifth delay device 1130 responsive to generation of the refresh window signal (i.e., Refresh Window), and select and output a delay signal of the fourth delay device 1120 responsive to no generation of the refresh window signal (i.e., Refresh Window). In this way, responsive to generation of the refresh window signal (i.e., Refresh Window), a delay duration of the selected and outputted delay signal of the fifth delay device 1130 is shorter. Compared to the normal refresh mode, based on the first delay submodule 810, the third delay submodule 860 may further shorten the pulse duration of the first control signal SAFI.

In conclusion, according to the example embodiments of the present disclosure, through setting that the pulse duration of the first control signal generated in the refresh mode is less than the pulse duration of the first control signal generated in the normal read-write mode, the duration of the supply of the first power voltage VDD adopted in the refresh mode is less than the duration of the supply of the first power voltage VDD adopted in the normal read-write mode. By reducing the duration of the supply of the first power voltage VDD in the refresh mode, it can not only meet the refresh demands that do not have higher requirements for the tRCD performance, but also reduce the consumption of first power voltage VDD current in the refresh process, thus avoiding a probability of generating excessive instantaneous current in the refresh mode, and reducing the design requirements for the first power voltage VDD carrying capacity.

It is to be noted that although various steps of the method in the present disclosure are described in a specific order in the accompanying drawings, it does not require or imply that these steps are necessarily performed in the specific order, or that all the steps illustrated are necessarily performed in order to achieve the desired result. Additionally or alternatively, some steps may be omitted, a plurality of steps may be combined into one step for execution, and/or one step may be decomposed into a plurality of steps for execution, and the like.

In addition, the example embodiment also provides a method for controlling a memory. The method for controlling a memory is applied to control the memory which includes the sense amplifier. A power voltage of the sense amplifier is controlled and supplied by a first control signal SAP1 or a second control signal SAP2, and a power voltage VDD controlled and supplied by the first control signal SAP1 is greater than a power voltage VARY controlled and supplied by the second control signal SAP2.

Figure 12:
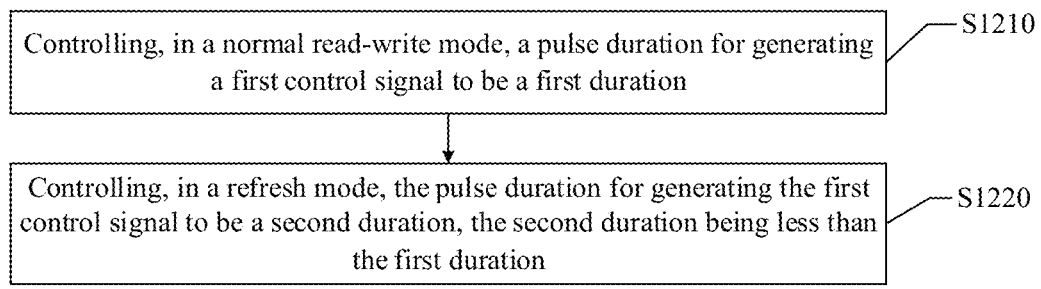
FIG. 12 schematically illustrates a flowchart of operations of a method for controlling a memory according to an exemplary embodiment of the present disclosure.

Referring to FIG. 12, the method for controlling a memory includes the following operations.

In S1210, in a normal read-write mode, a pulse duration for generating the first control signal is controlled to be a first duration.

In S1220, in a refresh mode, the pulse duration for generating the first control signal is controlled to be a second duration, the second duration being less than the first duration.

In an example embodiment of the present disclosure, in the normal read-write mode or the refresh mode, generation of the second control signal is controlled responsive to termination of the first control signal.

In an example embodiment of the present disclosure, the method for controlling a memory further includes: controlling, in the normal read-write mode or the refresh mode, the pulse duration for generating the second control signal to be greater than the pulse duration for generating the first control signal.

In an example embodiment of the present disclosure, the second duration is 0.

In an example embodiment of the present disclosure, the method for controlling a memory further includes: directly generating, in the refresh mode, the second control signal without generating the first control signal.

In an example embodiment of the present disclosure, a negative voltage of the sense amplifier is controlled and supplied by a negative control signal SAN. The method for controlling a memory further includes: controlling generation of the negative control signal after generating the first control signal or the second control signal.

In an example embodiment of the present disclosure, the memory further includes a word line, a bit line, and a complementary bit line. The sense amplifier is disposed between the bit line and the complementary bit line. Before generating the first control signal or the second control signal, the method for controlling a memory further includes: turning off a bit line balance control signal BLEQ applied to the bit line and the complementary bit line; and applying a word line turn-on voltage SWL to the word line, to turn on a transistor connected to the word line.

In an example embodiment of the present disclosure, the method for controlling a memory further includes: controlling the memory to enter the refresh mode responsive to simultaneous acquisition of the memory block activation window signal BANK ACT Window and the refresh window signal Refresh Window, and controlling the memory to enter the normal read-write mode responsive to acquisition of the activation window signal BANK ACT Window only.

The specific details of the method for controlling a memory are described in detail in the corresponding memory read-write circuit, and therefore are not repeated herein.

The example embodiments of the present disclosure further provide an electronic device, including a plurality of arrays, a plurality of array controllers, and a plurality of the memory read-write circuits. The memory read-write circuits are disposed in the array controllers, and each memory read-write circuit controls a corresponding array. The specific details of the memory read-write circuit are described in detail in the embodiments above, and therefore are not repeated herein.

In the foregoing embodiments, units can be implemented in whole or in part by software, hardware, firmware or a combination thereof. When implemented by a software program, the units can be implemented in the form of a computer program product in whole or in part. The computer program product includes one or more computer instructions. When the computer program instruction is loaded and executed on the computer, the processes or functions described in the embodiments of the present disclosure are generated in whole or in part. The computer may be a general-purpose computer, a special-purpose computer, a computer network, or other programmable apparatuses. The computer instruction may be stored in a computer-readable storage medium or transmitted from one computer-readable storage medium to another computer-readable storage medium. The computer-readable storage medium may be any available medium that can be accessed by a computer or a data storage device such as a server or data center integrated with one or more available media. The available medium may be a magnetic medium (for example, a floppy disk, a hard disk, a magnetic tape), an optical medium (for example, a DVD), or a semiconductor medium (for example, a solid state disk (SSD)), etc. In the embodiments of the present disclosure, the computer may include the foregoing device.

Although the present disclosure is described herein in connection with various embodiments, a person skilled in the art may understand and implement other variations of the disclosed embodiments by reviewing the drawings, the present disclosure, and the appended claims, in practicing the claimed present disclosure. In the claims, the wording "comprising" does not exclude other components or steps, and "a" or "an" does not exclude a plurality. A single processor or other unit may fulfill the functions of several items recited in the claims. Some measures are recited in mutually different dependent claims, it does not indicate that these measures cannot be combined to produce good effect.

Although the present disclosure is described in conjunction with specific features and embodiments thereof, it is apparent that various modifications and combinations may be made therein without departing from the spirit and scope of the present disclosure. Accordingly, the specification and the drawings are merely exemplary illustrations of the present disclosure as defined by the appended claims, and are deemed to cover any and all modifications, variations, combinations or equivalents within the scope of the present disclosure. It is apparent to a person skilled in the art that various modifications and variations may be made in the present disclosure without departing from the spirit and scope of the present disclosure. In this way, provided that these modifications and variations of the present disclosure fall within the scope of the claims and equivalent techniques thereof of the present disclosure, the present disclosure is also intended to cover such modifications and variations.

What is claimed is:

1. A memory read-write circuit, comprising:
a sense amplifier, wherein a power voltage of the sense amplifier is controlled and supplied by a first control signal or a second control signal, and a first power voltage controlled and supplied by the first control signal is greater than a second power voltage controlled and supplied by the second control signal; and
a control signal generation module, configured to control, in a normal read-write mode, a pulse duration for generating the first control signal to be a first duration, and control, in a refresh mode, a pulse duration for generating the first control signal to be a second duration, the second duration being less than the first duration;
wherein the memory read-write circuit further comprises a word line, a bit line, and a complementary bit line, wherein the sense amplifier is disposed between the bit line and the complementary bit line;
wherein the control signal generation module is further configured to turn off, before generating the first control signal and the second control signal, a bit line balance control signal applied to the bit line and the complementary bit line and apply a word line turn-on voltage to the word line, to turn on a transistor connected to the word line;
wherein the memory read-write circuit further comprises an activation window signal generation module and a refresh window signal generation module, wherein the activation window signal generation module and the refresh window signal generation module are respectively connected to the control signal generation module;
wherein the activation window signal generation module is configured to generate a memory block activation window signal, and the refresh window signal generation module is configured to generate a refresh window signal; and the control signal generation module is configured to control a memo to enter the refresh mode responsive to simultaneous acquisition of the memory block activation window signal and the refresh window signal, and control the memory to enter the normal read-write mode responsive to acquisition of the memory block activation window signal only.

2. The memory read-write circuit of claim 1, wherein the control signal generation module is further configured to control, in the normal read-write mode or the refresh mode, generation of the second control signal responsive to termination of the first control signal.

3. The memory read-write circuit of claim 2, wherein the control signal generation module is further configured to control, in the normal read-write mode or the refresh mode, the pulse duration for generating the second control signal to be greater than the pulse duration for generating the first control signal.

4. The memory read-write circuit of claim 1, wherein the second duration is 0.

5. The memory read-write circuit of claim 4, wherein the control signal generation module is further configured to directly generate, in the refresh mode, the second control signal without generating the first control signal.

6. The memory read-write circuit of claim 1, wherein a negative voltage of the sense amplifier is controlled and supplied by a negative control signal, and the control signal generation module is further configured to control generation of the negative control signal after generating the first control signal or the second control signal.

7. The memory read-write circuit of claim 1, wherein the control signal generation module comprises a first delay submodule, a second delay submodule, and a first NAND gate; wherein
an input terminal of the first NAND gate is connected to an output terminal of the first delay submodule and an output terminal of the second delay submodule, and an output terminal of the first NAND gate outputs the first control signal; and
an input terminal of the second delay submodule is connected to the output terminal of the first delay submodule, an input terminal of the first delay submodule is inputted with the memory block activation window signal, and the output terminal of the second delay submodule outputs the second control signal.

8. The memory read-write circuit of claim 7, wherein the first delay submodule comprises a first delay unit and a second NAND gate; wherein
an input terminal of the second NAND gate is connected to an output terminal of the first delay unit and is inputted with the memory block activation window signal, and an input terminal of the first delay unit is inputted with the memory block activation window signal.

9. The memory read-write circuit of claim 8, wherein the first delay unit comprises a first multiplexer, and a first delay device and a second delay device which are connected to the first multiplexer; wherein
the first delay device and the second delay device are respectively configured to delay the memory block activation window signal, and a delay duration of the first delay device is greater than a delay duration of the second delay device;
a control terminal of the first multiplexer is inputted with the refresh window signal, and the first multiplexer is configured to select and output a delay signal of the second delay device responsive to generation of the refresh window signal, and select and output a delay signal of the first delay device responsive to no generation of the refresh window signal.

10. The memory read-write circuit of claim 7, wherein the second delay submodule comprises a second delay unit and a first AND gate; wherein
an input terminal of the first AND gate is respectively connected to an output terminal of the second delay unit and the output terminal of the first delay submodule, and an input terminal of the second delay unit is connected to the output terminal of the first delay submodule.

11. The memory read-write circuit of claim 10, wherein the second delay unit comprises a third delay device, a delay selection unit, and a second multiplexer; wherein
the third delay device is configured to delay an output signal of the first delay submodule, an input terminal of the delay selection unit is inputted with the output signal of the first delay submodule, and an output terminal of the delay selection unit is connected to an input terminal of the second multiplexer; and
a control terminal of the second multiplexer is inputted with the refresh window signal, and the second multiplexer is configured to select and output an output signal of the delay selection unit responsive to generation of the refresh window signal, and select and output an output signal of the first delay unit delayed by the third delay device responsive to no generation of the refresh window signal.

12. The memory read-write circuit of claim 11, wherein the delay selection unit comprises a delay subunit and a sub-multiplexer; wherein
an input terminal of the delay subunit is inputted with the output signal of the first delay submodule, and an input terminal of the sub-multiplexer is inputted with the output signal of the first delay submodule and an output signal of the delay subunit; and
a control terminal of the sub-multiplexer is inputted with a test signal, and controls a pulse length of the first control signal to be 0 under an action of the test signal.

13. The memory read-write circuit of claim 8, wherein the control signal generation module further comprises a bit line balance control signal generation submodule, a word line turn-on voltage generation submodule, and a third delay submodule; wherein
an input terminal of the bit line balance control signal generation submodule is inputted with the memory block activation window signal, and an output terminal of the bit line balance control signal generation submodule outputs the bit line balance control signal;
an input terminal of the word line turn-on voltage generation submodule is connected to an output terminal of the third delay submodule, an output terminal of the word line turn-on voltage generation submodule outputs the word line turn-on voltage, and an input terminal of the third delay submodule is inputted with the memory block activation window signal.

14. The memory read-write circuit of claim 13, wherein the third delay submodule comprises a third delay unit and a second AND gate; wherein
an input terminal of the second AND gate is inputted with an output signal of the third delay unit and the memory block activation window signal, and an input terminal of the third delay unit is inputted with the memory block activation window signal.

15. The memory read-write circuit of claim 14, wherein the third delay unit comprises a third multiplexer, and a fourth delay device and a fifth delay device which are connected to the third multiplexer; wherein
the fourth delay device and the fifth delay device are respectively configured to delay the memory block activation window signal, and a delay duration of the fourth delay device is greater than a delay duration of the fifth delay device; and
a control terminal of the third multiplexer is inputted with the refresh window signal, and the third multiplexer is configured to select and output a delay signal of the fifth delay device responsive to generation of the refresh window signal, and select and output a delay signal of the fourth delay device responsive to no generation of the refresh window signal.

16. An electronic device, comprising a plurality of memory blocks, a plurality of array controllers, and a plurality of memory read-write circuits of claim 1; wherein the memory read-write circuits are disposed in the array controllers, each memory read-write circuit controls one memory block, and one memory block comprises a plurality of memory cells.

17. A method for controlling a memory, wherein the memory comprises a sense amplifier, a power voltage of the sense amplifier is controlled and supplied by a first control signal or a second control signal, and a power voltage controlled and supplied by the first control signal is greater than a power voltage controlled and supplied by the second control signal; and the method comprises:
controlling, in a normal read-write mode, a pulse duration for generating the first control signal to be a first duration; and
controlling, in a refresh mode, the pulse duration for generating the first control signal to be a second duration, the second duration being less than the first duration;
wherein the method further comprises:
controlling the memory to enter the refresh mode responsive to simultaneous acquisition of an activation window signal and a refresh window signal; and
controlling the memory to enter the normal read-write mode responsive to acquisition of the activation window signal only.

18. The method for controlling a memory of claim 17, further comprising:
controlling, in the normal read-write mode or the refresh mode, generation of the second control signal responsive to termination of the first control signal.

* * * * *